United States Patent
Ohno et al.

(10) Patent No.: US 6,831,749 B2
(45) Date of Patent: Dec. 14, 2004

(54) SAGNAC INTERFEROMETER CURRENT SENSOR

(75) Inventors: Aritaka Ohno, Tokyo (JP); Ryuji Usui, Tokyo (JP); Kiyohisa Terai, Kanagawa (JP); Masao Takahashi, Kanagawa (JP); Kinichi Sasaki, Kanagawa (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 137 days.

(21) Appl. No.: 10/070,076

(22) PCT Filed: Jul. 5, 2001

(86) PCT No.: PCT/JP01/05853

§ 371 (c)(1),
(2), (4) Date: Mar. 1, 2002

(87) PCT Pub. No.: WO02/04964

PCT Pub. Date: Jan. 17, 2002

(65) Prior Publication Data

US 2002/0122183 A1 Sep. 5, 2002

(30) Foreign Application Priority Data

Jul. 7, 2000 (JP) ..................................... 2000-206197

(51) Int. Cl.[7] ................................................ G01B 9/02
(52) U.S. Cl. ...................................................... 356/483
(58) Field of Search ................................ 356/483, 460, 356/450, 459, 464, 477, 491

(56) References Cited

U.S. PATENT DOCUMENTS 5,365,337 A * 11/1994 Page et al. ................. 356/462
6,301,400 B1 * 10/2001 Sanders ......................... 385/12
6,563,589 B1 * 5/2003 Bennett et al. .............. 356/483

FOREIGN PATENT DOCUMENTS

| JP | 6347275 | 12/1994 |
|---|---|---|
| JP | 7191061 | 7/1995 |
| JP | 7198398 | 8/1995 |
| JP | 11316247 | 11/1999 |

OTHER PUBLICATIONS

Frosio, G., et al., "All–Fiber Sagnac Current Sensor" Opto92, ESI Publications, Paris 1992, pp. 1–5.

Blake, James, "Current Sensors based on the Sagnac Interferometer" SPIE vol. 2837, p. 166–171.

* cited by examiner

Primary Examiner—Zandra V. Smith
Assistant Examiner—Andrew H. Lee
(74) Attorney, Agent, or Firm—David N. Lathrop, Esq.; Gallagher & Lathrop

(57) ABSTRACT

A depolarizer 11 is inserted between an optical branch unit 2 and a polarization filter 3, a depolarizer 12 and a polarization filter 14 are inserted between an optical phase modulator 5 and a quarter-wave plate 16, and a depolarizer 13 and a polarization filter 15 are inserted between the other branch end of the optical branch unit 4 and a quarter-wave plate 17. The optical branch unit 2 and the optical phase modulator 5 are formed by single mode optical fibers, and single mode optical fibers are used to connect between optical elements, thus providing an arrangement which is inexpensive as a whole.

10 Claims, 8 Drawing Sheets

SAGNAC INTERFEROMETER CURRENT SENSOR

TECHNICAL FIELD

The present invention relates to a current sensor using a Sagnac interferometer including an optical fiber coil set within a magnetic field generated by a current and through which a clockwise and counter-clockwise light are propagated to undergo a Faraday effect to have their polarization planes rotated in mutually opposite directions to produce a phase difference between them, whereby the detection of the phase difference allows the current to be determined.

BACKGROUND OF THE INVENTION

The measurement of a current through a transmission line used in the art of power transmission and distribution generally employs a transformer comprising an iron core and a coil winding thereon. Since the transformer represents a purely electrical instrument, it is required that the transformer satisfies electrical noise resistance and dielectric strength requirements, and depending on the location where it is installed, a consideration must be paid to the outer profile and dimension.

Sagnac interferometer comprising an optical fiber coil is being investigated and developed for its use in a current sensor which is free from influences of electrical noises and which does not require a dielectric strength to be secured. Sagnac interferometer comprising an optical fiber coil has been used in the art of detecting the rotation of a moving body in an optical fiber gyro application. In addition to detecting the rotation, Sagnac interferometer exhibits a response to a magnetic field generated by a current and such response can be utilized to determine a current. Specifically, when a magnetic field is applied to an optical fiber coil which comprises a transparent material, the Faraday effect causes a rotation of a polarization plane, and an angle of rotation of the polarization plane is proportional to both the strength of the magnetic field and a distance through which a light passes in the magnetic field. A phase difference is produced between dextrorotatory and levorotatory light passing through the optical fiber coil due to a rotation of the polarization plane. The detection of the phase differences allows the magnitude of the current which generated the magnetic field to be determined. A conventional example of a current sensor using a Sagnac interferometer will now be described with reference to FIG. 1.

In FIG. 1, light emitted from a light source 1 passes through an optical directional coupler or a first optical branch unit 2, and further passes through a first polarization filter 3 to a second optical branch unit 4 where it is split into levorotatory and dextrorotatory light to impinge on a current sensing coil 6. The levorotatory light is modulationed in a phase modulator 5, whereupon it passes through a quarter-wave plate 16, impinges on one end of the coil 6, proceeds through the coil 6 as levorotatory light to be emitted therefrom, impinges on a second quarter-wave plate 17, and then successively passes through the second optical branch unit 4 and the first polarization filter 3 to impinge on the first optical branch unit 2 where it is branched into a light receiver 7 to be received thereby. On the other hand, dextrorotatory light from the second optical branch unit 4 passes through the second quarter-wave plate 17 to impinge on the current sensing coil 6, proceeds through the coil 6 clockwise to be emitted therefrom, impinges on the first quarter-wave plate 16 where its optical phase is modulated in the phase modulator 5. The phase modulated dextrorotatory light successively passes through the second optical branch unit 4 and the first polarization filter 3 to impinge on the first optical branch unit 2 where it is branched into the light receiver 7 to be received thereby. It is to be understood that each of the first quarter-wave plate 16 and the second quarter-wave plate 17 converts a linearly polarized light which is incident from the polarization filter 3 into a circularly polarized light which is emitted, and also converts a circularly polarized incident light into a linearly polarized emitted light. It will be noted that a modulation input is input to the phase modulator 5 from an oscillation circuit 9 in order to perform an optical phase modulation of dextrorotatory and levorotatory light.

When an electric wire 10 is brought close to an end of the current sensing coil 6 which is subject to a magnetic field such that the diametrical direction of the coil is on an extension of the wire 10, a phase difference is produced between the dextrorotatory light and the levorotatory light after passing through the coil 6, and the dextrorotatory light and the levorotatory light emitted from the coil are subject to a synthesizing interference in the second optical branch unit 4, with consequence that the light receiver 7 receives phase modulated light having an optical strength which varies in accordance with the phase difference. A change in the strength of the interfered light has a frequency which coincides with the frequency of the modulation signal from the oscillation circuit 9, and a phase which corresponds to the phase difference between the levorotatory light and the dextrorotatory light. Upon reaching the light receiver 7, the phase modulated light is converted into an electrical signal having an amplitude which varies in accordance with the optical strength. The electrical signal which is obtained by the photoelectric conversion is input to a synchronous detector 8. The modulation signal which is supplied to the phase detector 5 is input to the synchronous detector 8 from the oscillation circuit 9 as a reference signal, thus performing a synchronous detection of the output from the light receiver 7 which is input thereto. The synchronous detection output corresponds to the phase difference which is in turn proportional to the magnetic field applied to the current sensing coil 6. (For details of the phase modulation, see Japanese Laid-Open Patent Applications No. 99/351883 and 01/21363.)

As mentioned above, a current sensor using a Sagnac interferometer determines the magnitude of a current which generated a magnetic field applied to a current sensing coil, by causing circularly polarized lights to impinge on opposite ends of the coils and propagate therethrough as a levorotatory light and a dextrorotatory light and causing the both lights having a phase difference therebetween to interfere with each other so that the resulting interfered light has a varying optical strength which can be used to determine the magnitude of the current.

In order for Sagnac interferometer to operate as a current sensor, it is necessary that circularly polarized lights be incident on the current sensing coil 6 as mentioned above. To satisfy this requirement, in the conventional example shown in FIG. 1, optical fibers or fiber portions shown in thick lines are constructed by polarization maintaining optical fibers. Specifically, except for the optical fiber which forms the current sensing coil 6, an optical fiber extending from the light source 1 to the first optical branch unit 2 and having a length on the order of one meter, an optical fiber extending from the first branch unit 2 to the first polarization filter 3 and having a length on the order of one meter, an optical fiber extending from the first polarization filter 3 to the second optical branch unit 4 and having a length on the order of one meter, and an optical fiber extending from the second optical branch unit 4 to the phase modulator 5 and having a length on the order of one meter are each formed by a polarization maintaining optical fiber. Assuming a total length of the optical fiber which forms the current sensing coil 6 to be ten meters, the length of each of optical fibers extending from the second optical branch unit 4 to the first quarter-wave plate 16 and extending from the second optical branch unit 4 to the second quarter-wave plate 17 has a length which is chosen to be about fifty meters, each optical fiber of such length being formed by a polarization maintaining optical fiber. In the conventional example shown, the first optical branch unit 2, the first polarization filter 3, and the second optical branch unit 4 are also formed by polarization maintaining optical fibers, as shown.

It is to be understood that a considerable length of time is required for the alignment of the proper axis of light from the light source 1 with the proper axis of a polarization maintaining optical fiber which connects to the first optical branch unit 2, and accordingly, this current sensor is correspondingly expensive. In addition, a polarization maintaining optical fiber is much more expensive than a singlemode optical fiber which does not maintain polarization. For this reason, the conventional current sensor of Sagnac interferometer type shown in FIG. 1 is expensive.

FIG. 2 shows a current sensor using a Sagnac interferometer including a coil of length adjusting optical fiber added to the conventional example shown in FIG. 1.

In the Sagnac interferometer, a sensing coil comprises a winding of a single mode optical fiber. When it is used as a current sensing coil 6, a coil design having a total length on the order of ten meters will be sufficient for the purpose of detecting the current. In order to achieve a good sensitivity in detecting an electrical signal which is obtained as a result of a photoelectric conversion by the light receiver 7, it is common in Sagnac interferometer that the phase modulator 5 be inserted in one end of the sensing coil 6 to provide an optical phase modulation in an a.c. sense with respect to the levorotatory light and the dextrorotatory light as mentioned previously. When the sensing coil 6 has a length of optical fiber which is on the order of ten meters, there cannot be obtained a sufficient difference in the propagation time between the levo- and dextro-rotatory lights, making it difficult to achieve a sufficient modulation amplitude for the resulting interfered light. To overcome this problem, a length adjusting optical fiber coil 60 is connected in series to one end of the sensing coil 6 so that a length of optical fiber on the order of one hundred meters be established from one branch end of the second optical branch unit 4 to the other branch end thereof including the sensing coil 6 and the length adjusting optical fiber coil 60. Assuming a length of optical fiber for the sensing coil 6 equal to ten meters, the length adjusting optical fiber coil 60 is chosen to have a length on the order of ninety meters. Since an error of a modulation frequency relative to an optimum drive frequency of the phase modulator 5 is proportional to a spike signal width, which is responsible for a bias variation, a product of a length of sensing coil L inclusive of the length adjusting optical fiber coil 60 and the modulation frequency f is generally chosen so as to satisfy the following equation:

$$fL = c/2n$$

where c represents a light velocity and n a refractive index of the optical fiber.

Substituting $c=3\times10^8$ m/sec and $n=1.45$, it follows:

$$f L = 100 \text{ m MHz}$$

In the current sensor of Sagnac interferometer type shown in FIG. 2, except for the current sensing coil 6 which is to be formed by a single mode optical fiber, optical elements as well as optical fibers which connect between optical elements are formed by polarization maintaining optical fibers indicated by thick lines, and the length adjusting optical fiber coil 60 which is as long as ninety meters is also formed by a polarization maintaining optical fiber. This explains for an expensive price of the entire current sensor of Sagnac interferometer type.

It is an object of the present invention to provide a current sensor using a Sagnac interferometer which overcomes described problems caused by the use of polarization maintaining optical fibers.

DISCLOSURE OF THE INVENTION

The present invention is premised on the current sensor of Sagnac interferometer type in which an emitted light is passed through an optical directional coupler to impinge on a first polarization filter, which emits a linearly polarized light having a given plane of polarization which is then split into two beams in a second optical branch unit, one beam passing through an optical phase modulator and a first quarter-wave plate while the other beam passing through a second quarter-wave plate, whereby the both beams impinge upon the opposite ends of a current sensing coil as a levorotatory light and a dextrorotatory light. According to a first aspect of the present invention, a first depolarizer is inserted between the optical directional coupler and the first polarization filter.

Preferably a second depolarizer and a second polarization filter are inserted between the optical phase modulator and the first quarter-wave plate, and a third depolarizer and a third polarization filter are inserted between the other branch end of the second optical branch unit and the second quarter-wave plate.

According to a second aspect of the present invention, a second depolarizer and a second polarization filter are inserted between the optical phase modulator and the first quarter-wave plate, and a third depolarizer and a third polarization filter are inserted between the other branch end of the second optical branch unit and the second quarter-wave plate. A light source having no polarizing characteristic is used.

Also preferably a first length adjusting optical fiber coil is connected in series between one branch of the second optical branch unit and the first quarter-wave plate, and a second length adjusting optical fiber coil is connected in series between the other branch end of the second optical branch unit and the second quarter-wave plate, the both length adjusting optical fiber coils being wound in opposite directions to each other and having their center axes aligned on a common rectilinear line.

More preferably, the first and the second length adjusting optical fiber coil and the current sensing coil have their center axes which are substantially aligned on a common rectilinear line and phase changes of light occurring by the Sagnac effect to which the three coils are subject canceling each other.

Preferably, a separation is made between the optical directional coupler and the second optical branch unit, which are then connected together through a first optical connector/an extension optical fiber/a second optical connector 22. Alternatively, a separation may be made between the second branch unit and each of the first and the second quarter-wave plate, which can be preferably connected together by a first optical connector/two extension optical fibers/a second optical connector 22.

BEST MODES OF CARRYING OUT THE INVENTION

A mode of carrying out the present invention will be described with reference to an embodiment shown in FIG. 3.

Figure 1:
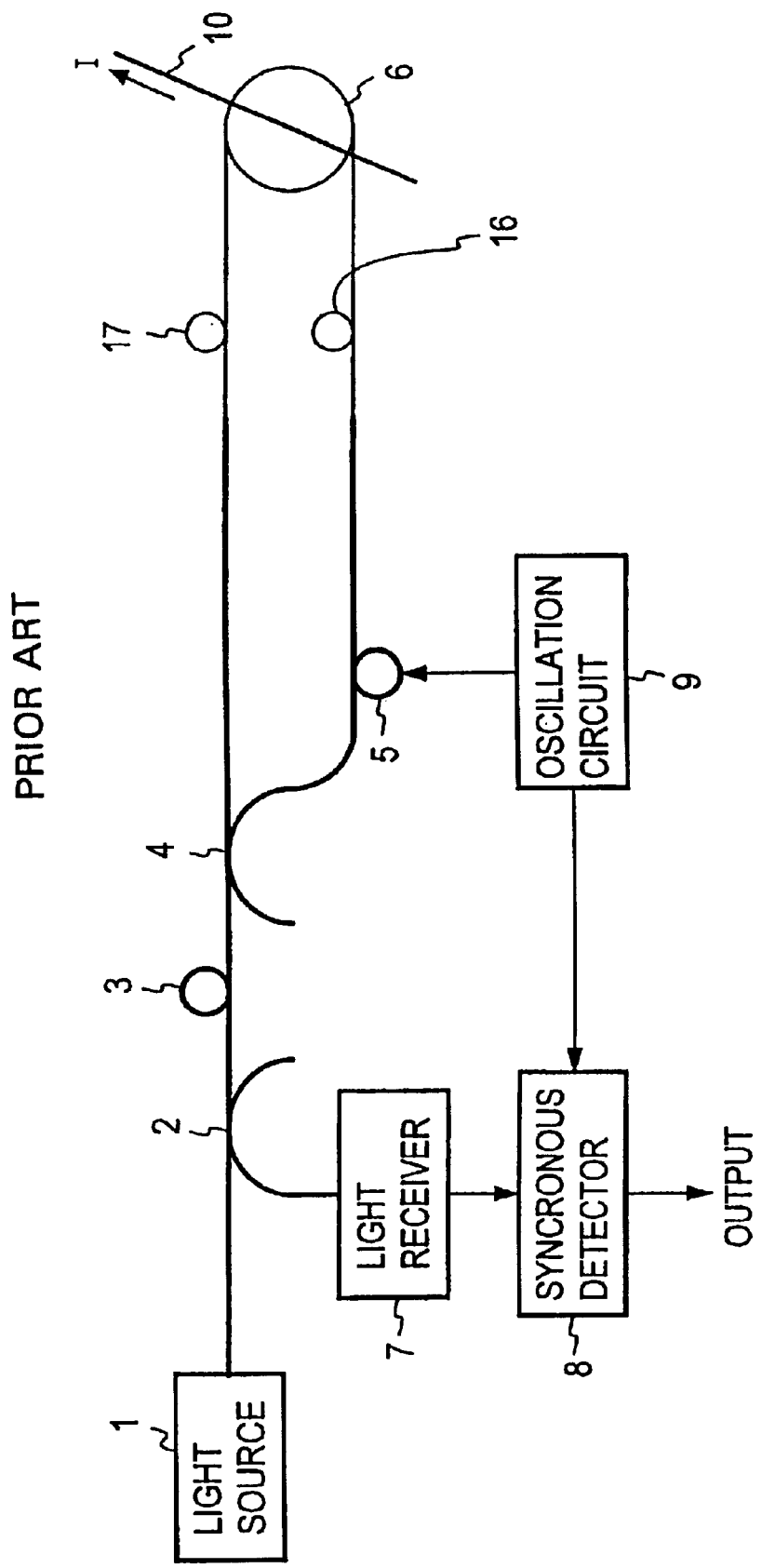
FIG. 1 is a schematic illustration of a conventional example.
Figure 3:
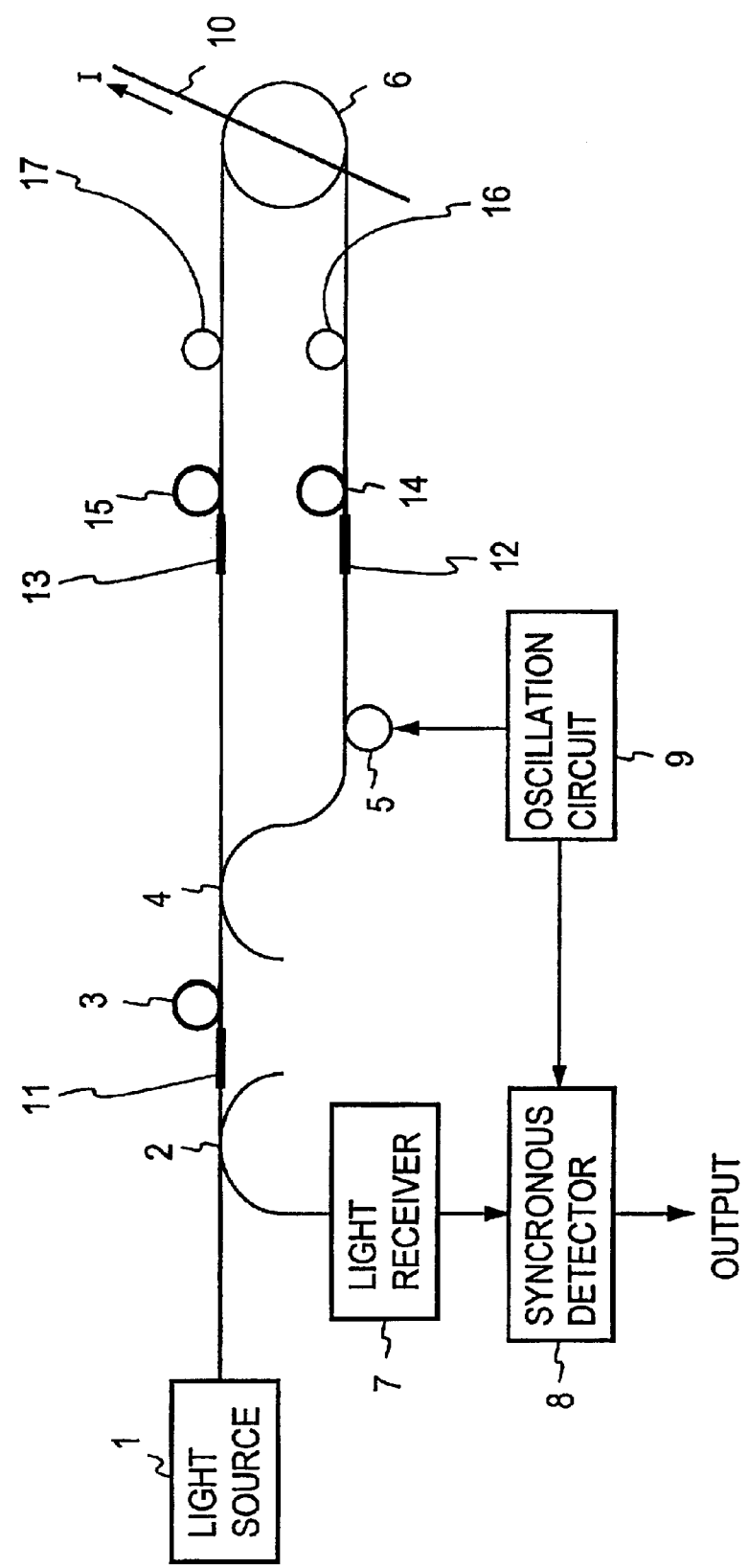
FIG. 3 is a schematic view of an embodiment of the present invention.

In FIG. 3, corresponding parts to those shown in FIG. 1 are designated by like reference numerals as used before. In this embodiment, optical fibers which connect between optical elements are formed by single mode optical fibers, and a depolarizer which receives an incident light and converts it into non-polarized light to be emitted is used.

Emitted light from a light source 1 is passed through a first optical branch unit 2, acting as an optical directional coupler, to impinge on a first depolarizer 11, and the transmitted light therefrom is converted into a non-polarized light having equal amounts of light between orthogonal modes. Non-polarized light which is emitted from the first depolarizer 11 impinges on a first polarization filter 3, where a linearly polarized light having a given plane of polarization is selectively emitted. The linearly polarized light impinges on a second optical branch unit 4 where it is split into a levorotatory and a dextrorotatory light. The branched levorotatory light is modulationed in a phase modulator 5, and a phase modulated levorotatory light impinges on a second depolarizer 12 to be converted into non-polarized light and then impinges on a second polarization filter 14 where it is converted into a linearly polarized light having a given plane of polarization. The linearly polarized light which is emitted from the second polarization filter 14 passes through a first quarter-wave plate 16 to be converted into a circularly polarized light, which impinges on one end of a current sensing coil 6 which is formed by a single mode optical fiber, proceeds counter-clockwise through the coil 6 to be emitted from the other end thereof. Subsequently, it successively passes through a second quarter-wave plate 17 and a third polarization filter 15 to be converted into a linearly polarized light having a given plane of polarization. The linearly polarized light is then converted into a non-polarized light by passing through a third depolarizer 13 to impinge on the second optical branch unit 4. The light passing through the second optical branch unit 4 successively passes through the first polarization filter 3 and the first depolarizer 11 to be converted into non-polarized light, which then impinges on the first optical branch unit 2 to be received by a light receiver 7.

On the other hand, the dextrorotatory light which is branched by the second optical branch unit 4 impinges on the third depolarizer 13 to be converted into non-polarized light, which then impinges on the third polarization filter 15 to be converted into a linearly polarized light having a given plane of polarization. This linearly polarized light passes through the second quarter-wave plate 17 to be converted into a circularly polarized light, which then impinges on the current sensing coil 6 to proceed clockwise through the coil 6 to be emitted therefrom. Subsequently, the emitted light successively passes through the first quarter-wave plate 16 and the second polarization filter 14 to be converted into a linearly polarized light having a given plane of polarization, which then passes through the second depolarizer 12 to be converted into non-polarized light, which then impinges on the phase modulator 5 to be subject to an optical phase modulation. The optically phase modulated dextrorotatory light passes through the second optical branch unit 4, the first polarization filter 3 and the first depolarizer 11 successively to be converted into non-polarized light, which then passes through the first optical branch unit 2 to be received by the light receiver 7.

Referring to FIG. 3, when a magnetic field which is generated by a current is applied to the current sensing coil 6, a phase difference occurs due to the Faraday effect under the influence of the magnetic field between the dextrorotatory light and the levorotatory light which have been converted into circularly polarized lights by the combination of the second polarization filter 14 and the first quarter-wave plate 16 or the combination of the third polarization filter 15 and the second quarter-wave plate 17 immediately before they impinge on the current sensing coil 6. If it is assumed that the Faraday effect acts on the dextrorotatory light in a positive sense, it follows that the Faraday effect acts on the levorotatory light in a negative sense. In this manner, the Faraday effect produces a phase difference between the dextrorotatory light and the levorotatory light. After passing through the current sensing coil 6, the levorotatory light and the dextrorotatory light are subject to a synthesizing interference in the second optical branch unit 4, with consequence that a phase modulated light having an optical strength which varies in accordance with the phase difference between the both is received by the light receiver 7. Upon reaching the light receiver 7, the interfered, phase modulated light is converted into an electrical signal having an amplitude which corresponds to a change in the optical strength thereof. An electrical signal from the light receiver 7 is subject to a synchronous detection in a synchronous detector 8 using a signal fed from an oscillation circuit 9 as a reference signal, thus providing a detection output which depends on the phase difference proportional to the magnetic field applied to the current sensing coil 6.

Depolarizer and non-polarized light will now be considered.

Figure 4:
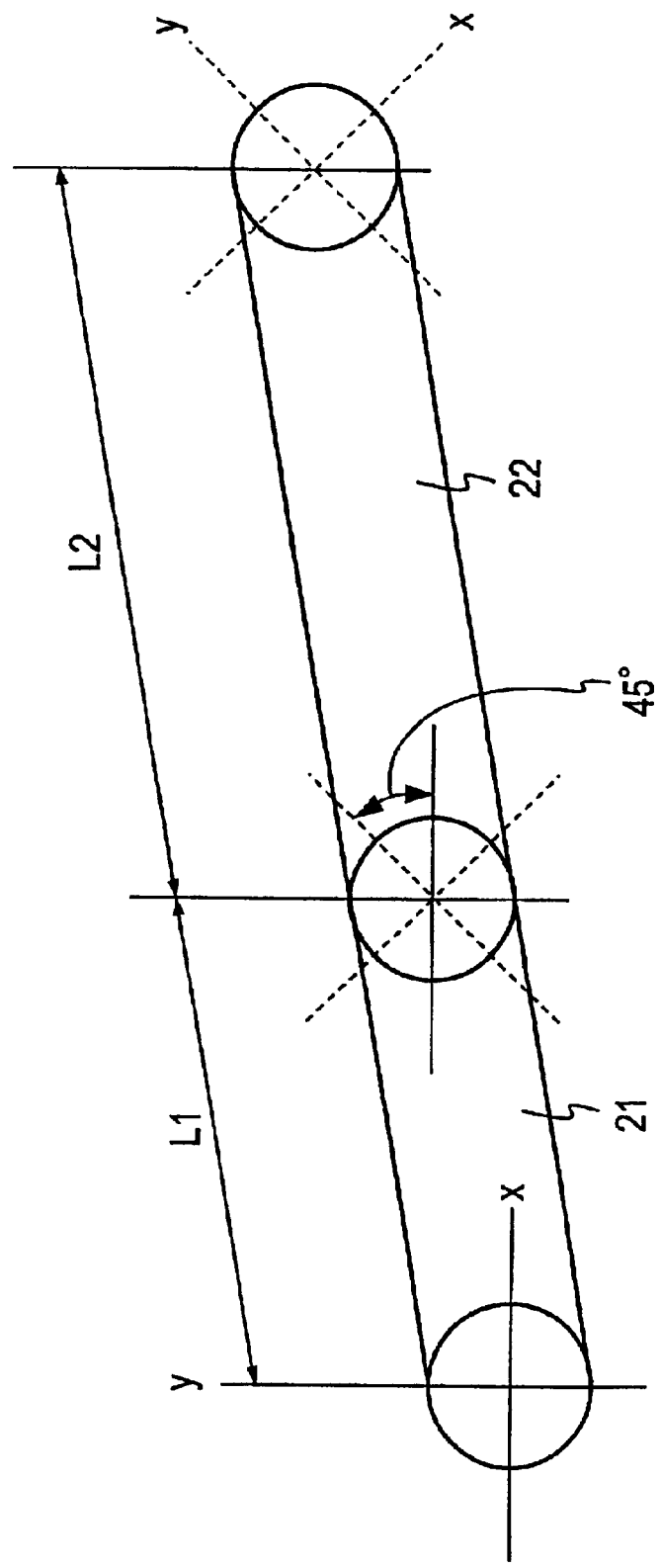
FIG. 4 is a diagram illustrating a depolarizer.

Non-polarized light refers to a light satisfying the requirements that an amount of light is equal between orthogonal modes and that the light between the orthogonal modes is incoherent. Light which satisfy these requirements is obtained by passage through a depolarizer. A depolarizer comprises a polarization maintaining optical fiber 21 having a length L1 and a polarization maintaining optical fiber 22 having a length L2, which have their one end faces cemented together, as shown in FIG. 4, for example. The ratio between the lengths L1 and L2 is chosen to be 1:2, and the both polarization maintaining optical fibers 21 and 22 are fused together so that their proper axes x, y are offset by 45° from each other. A depolarizer constructed in this manner is referred to as Lyot depolarizer having a unit length $L_u$ which is normally chosen so that a group delay time difference between orthogonal components as the light propagates along the pair of proper axes x, y of a polarization maintaining optical fiber is equal to or greater than coherent time of light (For detail, see Journal of Lightwave Technology, Vol. LT1, No. 1, March 1983, pp. 71–74).

A ratio between the lengths L1 and L2 of a polarization maintaining optical fiber is intended to provide a ratio in the group delay time difference between orthogonal components in a Lyot depolarizer. It is then assumed that a group delay time difference between orthogonal components which occur in the first depolarizer 11, the second depolarizer 12 and the third depolarizer 13 is greater than the coherent time of light, and that the group delay time difference between the orthogonal components which occur in the first depolarizer 11, the second depolarizer 12 and the third depolarizer 13 are in the ratio of 1:2:4, for example. It is assumed that each polarization maintaining optical fiber has an equal beat length. A group delay time difference between the proper axes x and y of a single depolarizer is equal to or greater than the coherent time of light, and the light which is converted into non-polarized light may have its plane of polarization rotated during its propagation through a single mode optical fiber, with consequence that while the component for the proper axis y, for example, has been lagging in the first depolarizer, the same component may be incident as x-component on the next depolarizer. In such instance, the light which has passed the next depolarizer may have its group delay time difference between the orthogonal components which may be equal to or less than the coherent time of light, thus failing to satisfy the requirement of non-polarization. If the group delay time difference of the next depolarizer is chosen to be twice that for the first depolarizer, it can be assured even in such instance that upon passage through the next depolarizer, the group delay time difference between the orthogonal components of the light is equal to or greater than the coherent time of light, thus assuring non-polarization.

It will be obvious from the arrangement of FIG. 1 that the ratio of the group delay time differences occurring in the depolarizers 11, 12 and 13 may also be chosen to be 4:1:2, the only requirement being that a greater difference than the ratio of 1:2:4 be chosen without regard to the sequence.

A unit length for the first depolarizer 11 or Lyot depolarizer is chosen to be 20 cm (ratio 1). A usual polarization maintaining optical fiber has a beat length on the order of 2 mm, and assuming the coherent time of light used on the order of $1.6 \times 10^{-13}$ second, the group delay time difference between the orthogonal components during the propagation through a polarization maintaining optical fiber having a length of 20 cm will be $2.7 \times 10^{-13}$, which is equal to or greater than the coherent time. It will be noted that this represents a coherent time for super-luminescent diode light source which is commonly used in an optical fiber gyro.

A unit length for Lyot depolarizer used as the second depolarizer 12 is chosen to be 40 cm (ratio 2), and a unit length for Lyot depolarizer used as the third depolarizer 13 is chosen to be 80 cm (ratio 4).

When such choice is made, the first depolarizer 11, the second depolarizer 12 and the third depolarizer 13 can be formed by polarization maintaining optical fibers while maintaining the group delay time difference between the orthogonal components resulting from the passage through the polarization maintaining optical fiber to be greater than the coherent time of light, and when the ratio of the group delay time differences between the orthogonal components of the first, the second and the third depolarizer 11, 12 and 13 is a ratio of 1:2:4 or 1:4:2 or greater, both the levo- and the dextro-rotatory light can be propagated through the optical path while remaining to be non-polarized and can be synthesized to suppress an error in the null-point drift due to polarized components.

In the embodiment shown in FIG. 3, optical fibers which connect between optical elements are all formed by single mode optical fibers as mentioned above, and accordingly, the plane of polarization may undergo a slight variation during the propagation through the single mode optical fibers, which do not assure that the plane of polarization be preserved.

However, by forming the optical fiber which connect between the light source 1 and the first optical branch unit 2 by an inexpensive single mode optical fiber and forming the first optical branch unit 2 by an inexpensive single mode optical fiber to allow light, the plane of polarization of which is not assured to be preserved, to be transmitted during the propagation and branching, the connection of the first depolarizer 11 between the first optical branch unit 2 and the first polarization filter 3 allows non-polarized light to be obtained, which may be caused to impinge on the first polarization filter 3 to provide a properly linearly polarized light. When the linearly polarized light which is emitted from the first polarization filter 3 propagates through the single mode optical fibers of increased lengths extending from the second optical branch unit 4 to the second depolarizer 12 and the third depolarizer 13, the plane of polarization may change, but if the plane of polarization is changed, the provision of the combination of the second depolarizer 12 and the second polarization filter 14 and the combination of the third depolarizer 13 and the third polarization filter 15 at the opposite ends of the current sensing coil 6 allows the polarized light to be restored to the linearly polarized light having the given plane of polarization, which is then caused to pass through the quarter-wave plates 16 and 17 to impinge on the current sensing coil 6 as a circularly polarized light which is required.

In a similar manner, the levo- and dextro-rotatory lights which have proceeded through and are emitted from the current sensing coil 6 are converted, by the combination of the second quarter-wave plate 17 and the third polarization filter 15 or the first quarter-wave plate 16 and the second polarization filter 14, into linearly polarized lights having a given plane of polarization while maintaining a phase difference which results from the passage through the current sensing coil 6. These linearly polarized lights are converted into non-polarized lights by the third depolarizer 13 and the second depolarizer 12, respectively, while maintaining a phase difference therebetween, and are then passed through the single mode optical fibers to be subject to a synthesizing interference in the second optical branch unit 4, thus producing an interfered light having a strength which varies in accordance with the phase difference. The interfered light is converted into a linearly polarized light having a given plane of polarization by the first polarization filter 3, and is then converted into non-polarized light by the first depolarizer 11 while maintaining the changing strength, and the interfered, non-polarized light is passed through the first optical branch unit 2, which comprises a single mode optical fiber, to impinge on the light receiver 7, where it is converted into an electrical signal having an amplitude which varies in accordance with the optical strength, and the electrical signal is subject to a synchronous detection in the detection circuit 8.

It will be seen from the foregoing that a current sensor using a Sagnac interferometer can be inexpensively provided as a whole while assuring a proper operation, by using the inexpensive single mode optical fibers for every optical path which connects between optical elements, providing the first depolarizer 11 between the first optical branch unit 2 and the first polarization filter 3, and providing combinations of depolarizer, polarization filter and quarter-wave plate on either end of the current sensing coil 6 to assure that any change in the plane of polarization which may have occurred may be returned to the given plane of polarization.

Figure 5:
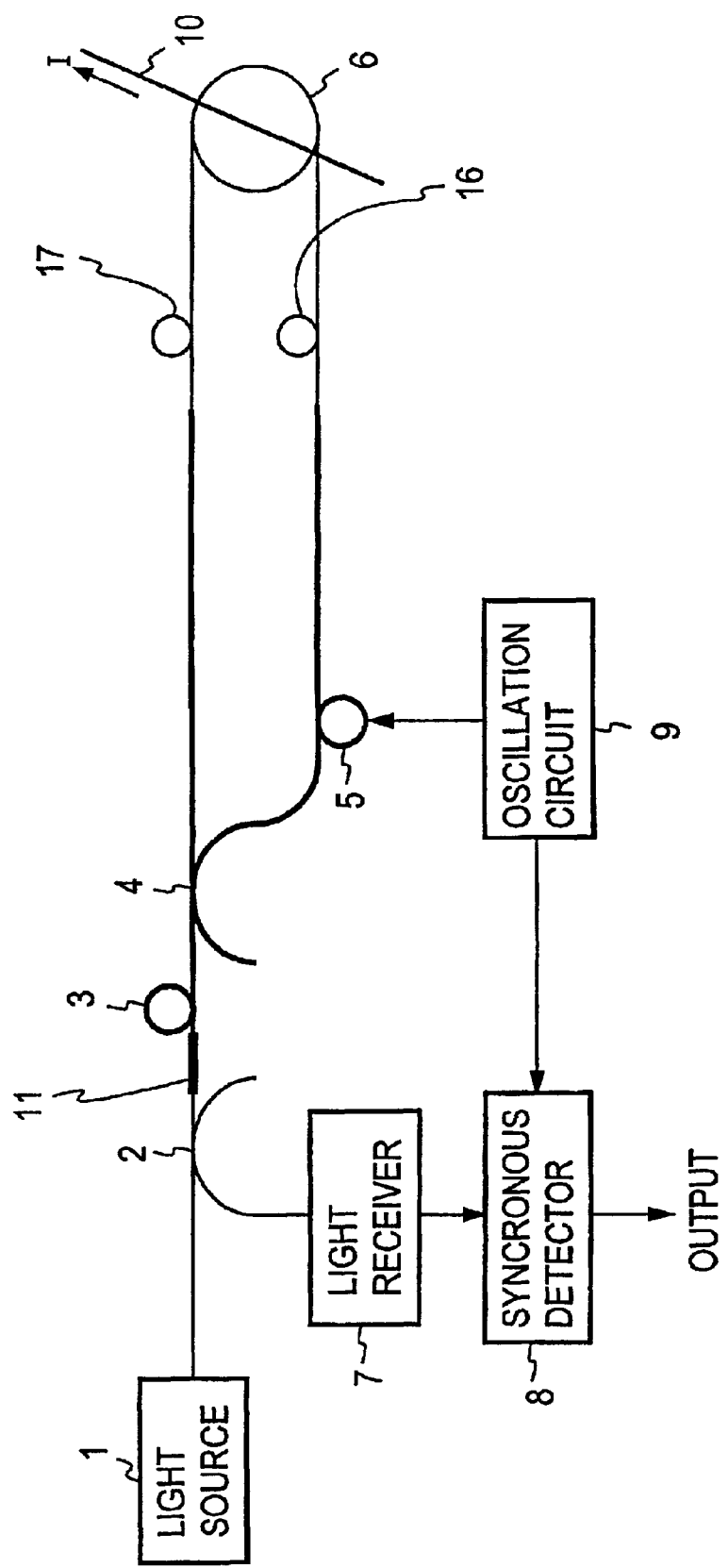
FIG. 5 is a schematic view of another embodiment of the present invention.

In an embodiment shown in FIG. 5, an optical fiber which connects between a light source 1 and a first optical branch unit 2 is formed by an inexpensive single mode optical fiber, the first optical branch unit 2 is formed by an inexpensive single mode optical fiber, and a first depolarizer 11 is connected between the first optical branch unit 2 and the first polarization filter 3. However, rather than providing a combination of a second depolarizer 12 and a second polarization filter 14 or a combination of a third depolarizer 13 and a third polarization filter 15 as in the embodiment shown in FIG. 3, each optical element and optical fiber which are located on a path from the second optical branch unit 4 to a first quarter-wave plate 16 and a second quarter-wave plate 17 is formed by a polarization maintaining optical fiber as in the conventional example shown in FIG. 1. In this embodiment, there is no assurance that the plane of polarization of light be preserved from the light source 1 to the first depolarizer 11, but the connection of the first depolarizer 11 between the first optical branch unit 2 and the first polarization filter 3 assures that non-polarized light is obtained, and this non-polarized light is caused to impinge on the first polarization filter 3 and is then carried on by a polarization maintaining optical fiber to impinge on the first quarter-wave plate 16 and the second quarter-wave plate 17 as a properly linearly polarized light.

In this embodiment, the light source 1 such as light emission diode (LED) which emits non-polarized light may be used, whereby the troublesome alignment between the proper axes of light from the light source 1 and the proper axes of the polarization maintaining optical fiber can be conveniently dispensed with.

In addition, in the embodiment shown in FIG. 3, the first depolarizer 11 may be eliminated, and a light source such as LED which emits non-polarized light may be used for the light source 1. A proper operation is also assured in this instance, and the alignment between the light source 1 and the optical fiber is dispensed with, and a single mode optical fiber can be used for the optical fiber, thus providing an inexpensive arrangement. The group delay time between the orthogonal components of the second depolarizer 12 and the third depolarizer 13 may be chosen to be 1 for one of them and 2 or greater for the other.

Figure 2:
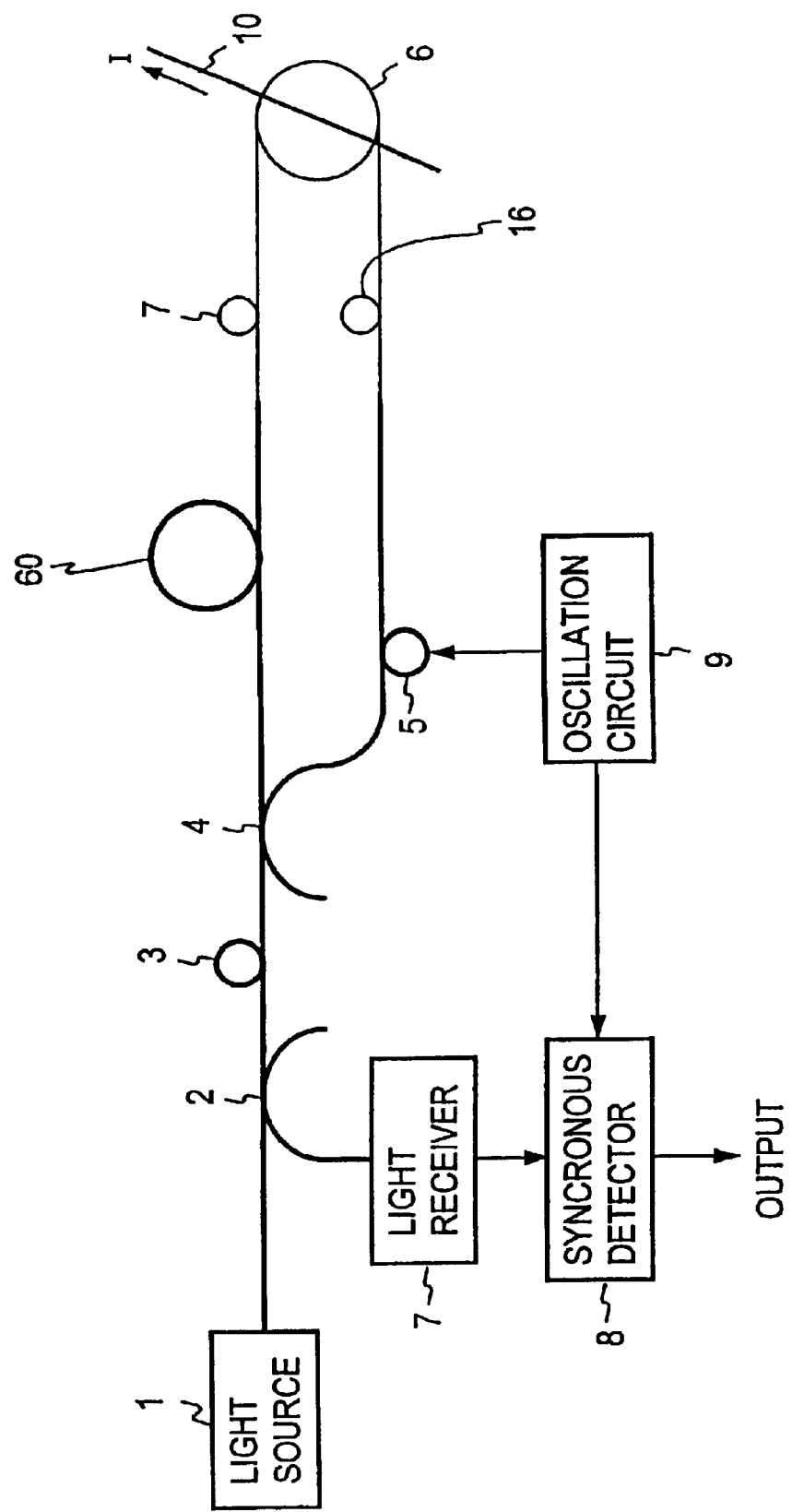
FIG. 2 is an illustration of another conventional example including a length adjusting optical fiber coil.

In the embodiments shown in FIGS. 3 and 5, a length adjusting optical fiber coil as shown in FIG. 2 may also be used. In this instance, a single mode optical fiber is used in the former while a polarization maintaining optical fiber is used in the latter to provide the length adjusting optical fiber coil.

Figure 6:
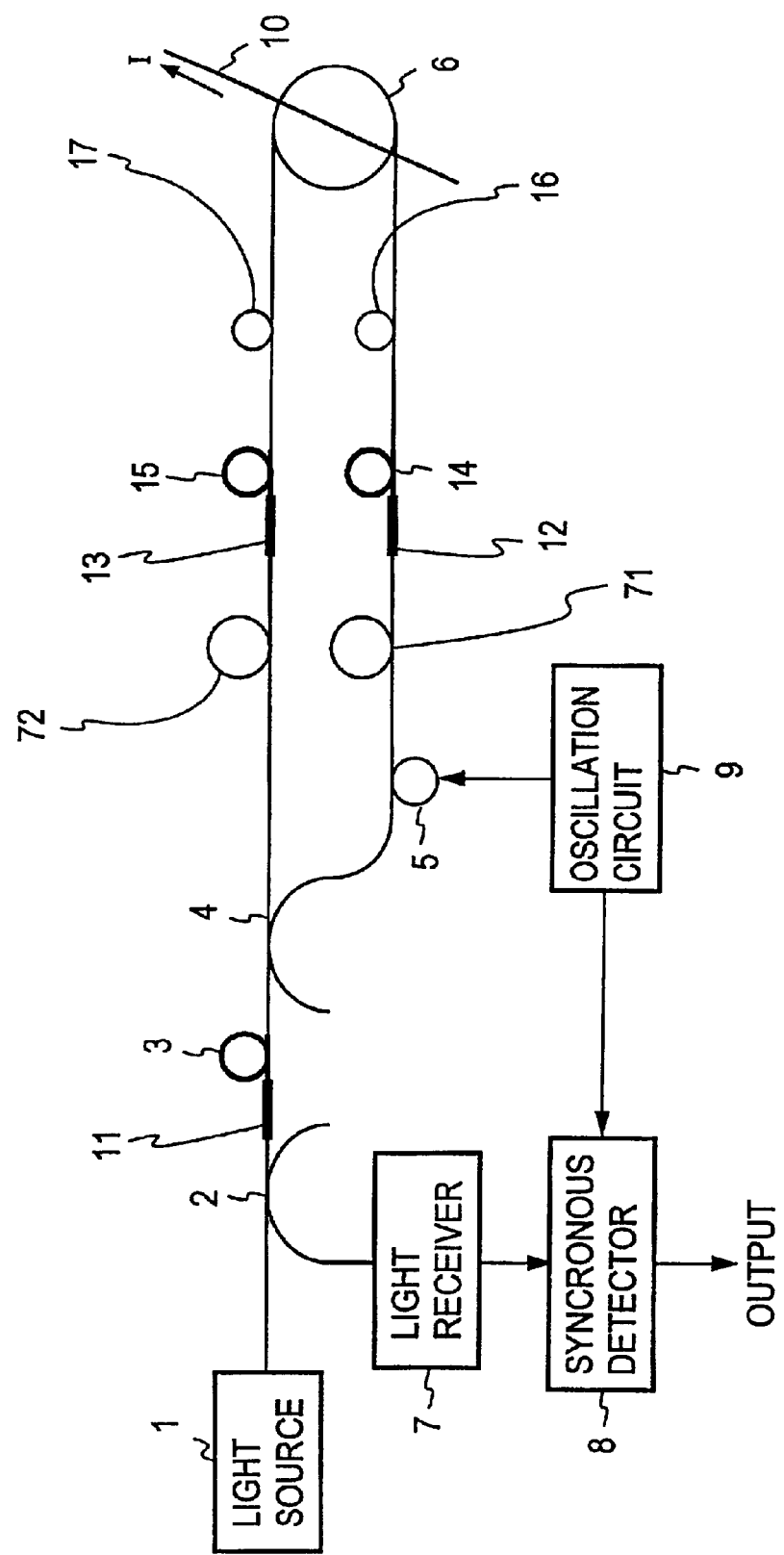
FIG. 6 is an illustration of an embodiment of the invention including a length adjusting optical fiber coil.

When the length adjusting optical fiber coil is used, an arrangement as shown in FIG. 6 will be used. In FIG. 6, corresponding parts to those shown in FIG. 3 are designated by like reference numerals as used before. A path of an optical fiber extending between one branch end of the second optical branch unit 4 and a first quarter-wave plate 16 is referred to as a first optical path while a path of an optical fiber extending between the other branch end of the second optical branch unit 4 and a second quarter-wave plate 17 is referred to as a second optical path.

In this embodiment, a counter-clockwise length adjusting optical fiber coil 71 is connected in series in the first optical path, and a clockwise length adjusting optical fiber coil 72 is connected in series in the second optical path. In other words, the length adjusting coil is divided between the both optical paths, and the counter-clockwise length adjusting optical fiber coil 71 and the clockwise length adjusting optical fiber coil 72 are both formed by single mode optical fibers, and are provided as optical fiber coils. These length adjusting optical fibers 71 and 72 provide Sagnac effect due to the rotation of the respective optical fiber coils, producing a change in the phase of the light which propagates through the length adjusting optical fiber 71 or 72. It is necessary that an arrangement be provided which prevents the Sagnac effect occurring in these length adjusting optical fiber coils 71 and 72 from influencing upon a phase difference between the levo- and dextro-rotatory light which occurs by the Faraday effect due to the magnetic field applied to the current sensing coil 6. Accordingly, the counter-clockwise length adjusting optical fiber coil 71 and the clockwise length adjusting optical fiber coil 72 are wound in opposite directions, and the both optical fiber coils 71 and 72 are disposed so that their center axes are substantially aligned on a common rectilinear line. With this arrangement, the Sagnac effect caused by the counter-clockwise length adjusting optical fiber coil 71 and the Sagnac effect caused by the clockwise length adjusting optical fiber coil 72 cancel each other. With a conventional current sensor as shown in FIG. 1, if the current sensing coil 6 rotates around the center axis thereof, a phase difference occurs between the levo- and dextro-rotatory lights due to the Sagnac effect, which represents an error in the detection of the current.

Accordingly, in the embodiment shown in FIG. 6, the intended purpose can be served by providing an arrangement such that a phase difference due to the Sagnac effect among the three coils, namely, the current sensing coil 6, the counter-clockwise length adjusting optical fiber coil 71 and the clockwise length adjusting optical fiber coil 72 be minimized as a whole. At this end, the coils 6, 71 and 72 are disposed so that their center axes are substantially aligned with each other, and the overall phase difference due to the Sagnac effect which result from a rotation of the current sensing coil 6, the optical fiber coil 71 and the optical fiber coil 72 can be minimized by satisfying the following requirement:

$$|R_c \times L_c + R_1 \times L_1 - R_2 \times L_2| < 5$$

where $R_c$ is a mean radius (for example, 0.5 m) of the current sensing coil, $L_c$ a fiber length (for example, 10 m) of the current sensing coil, $R_1$ a mean radius (for example, 0.035 m=35 mm) of the counter-clockwise length adjusting optical fiber coil 71, $L_1$ an optical fiber length (for example, 57 m) of the counter-clockwise length adjusting optical fiber coil 71, $R_2$ a mean radius (for example, 0.035 m=35 mm) of the clockwise length adjusting optical fiber coil 72, and $L_2$ an optical fiber length (for example, 200 m) of the clockwise length adjusting optical fiber coil 72.

When specific values indicated in parentheses are used, a total length of the optical fiber will be 267 m, which is a common optical fiber length for an optical fiber gyro which is a typical Sagnac interferometer. When the value on the right side of the above inequality is chosen to be 5, the phase difference which would occur by the Sagnac effect can be reduced to one half that occurring in the prior art as shown in FIG. 1 or less.

In addition, in the embodiment shown in FIG. 6, it is desirable that the cut-off wavelengths of each single mode optical fiber used in the first and the second optical path mentioned above may be offset by 100 nm or greater to the longer side in comparison to the wavelength of the light source. This may take place as mentioned below.

Light source 1: A semiconductor light source in 0.83 m wavelength band is used. This light source is universally used as a light source for a compact disc player.

Optical fiber: A single mode optical fiber for 1.3 m wavelength is used. This optical fiber has a cut-off wavelength on the order of 1.2 m, and is commonly used in optical communication.

Because the cut-off wavelength of the optical fiber is offset by 100 nm or greater to the longer side in comparison to the wavelength of the light source, higher modes propagate normally. However, as shown, the counter-clockwise length adjusting optical fiber coil 71 is connected in the first optical path while the clockwise length adjusting optical fiber coil 72 is connected in the second optical path, and both of them are formed into coils of a smaller diameter as mentioned above. Accordingly, the bending effect of these coils assists the higher modes to readily leak for preventing further propagation. The diameters of the optical fiber coils 71 and 72 are chosen to allow a leakage of the higher modes. In other words, inexpensive products for universal use can be used for the light source 1 and the single mode optical fibers.

It will be readily seen that the embodiment shown in FIG. 6 can operate satisfactorily as a current sensor, in the similar manner as the embodiment shown in FIG. 3, by providing a combination of a first depolarizer 11, a second depolarizer 12 and a second polarization filter 14 and a combination of a third depolarizer 13 and a third polarization filter 15 even though single mode optical fibers are used.

It is recognized that a current sensor using a Sagnac interferometer as mentioned above is required to be disposed such that an entire current sensor including the current sensing coil 6 be disposed close to an electric wire when detecting a magnetic field which is generated by the current through the electric wire, and this often involves inconveniences and difficulties in its installation and maintenance. Accordingly, an arrangement is chosen in which a current sensor using a Sagnac interferometer be mechanically divided into a plurality of blocks of optical elements which constitute the sensor and the divided blocks are connected together through optical connectors and optical fibers.

Figure 7:
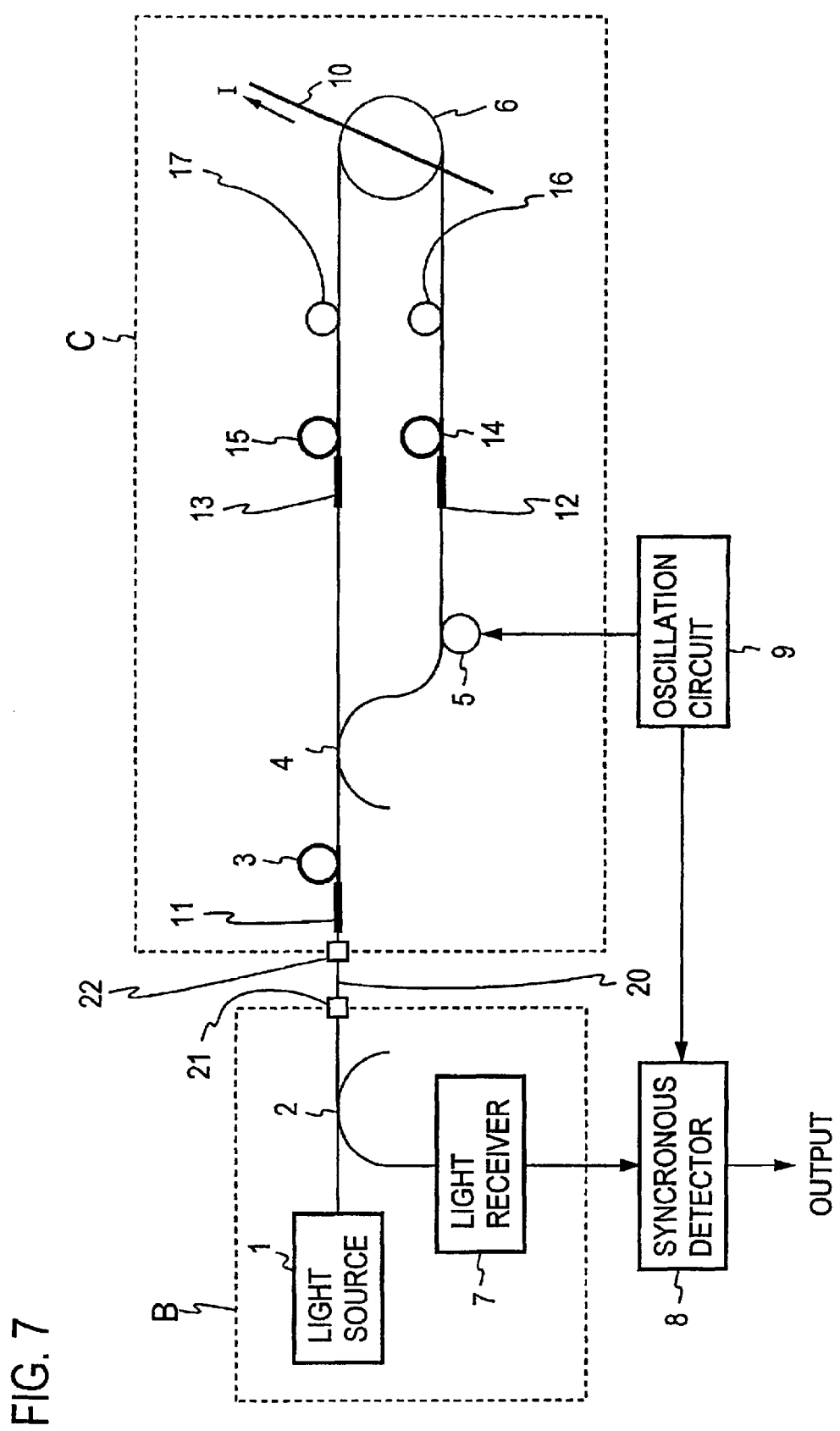
FIG. 7 is a schematic view of an embodiment of the invention which is divided into a plurality of blocks.

An embodiment of a current sensor using a Sagnac interferometer which is divided into a plurality of blocks of optical elements is shown in FIG. 7, where corresponding parts to those shown in FIG. 3 are designated by reference characters as used before.

In this embodiment, a separation is made between a first optical branch unit 2 and a second optical branch unit 4 to provide a light source block B and current sensing coil block C, which are connected together by using a first optical connector 21, a second optical connector 22, and an extended optical fiber 20 which connects between the first optical connector 21 and the second optical connector 22. The extended optical fiber 20 comprises a single mode optical fiber, and the first optical connector 21 and the second optical connector 22 comprise optical connectors which are used for connection with single mode optical fibers. While the separation is made between the first optical branch unit 2 and the first depolarizer 11 in FIG. 7, the separation may alternatively be made between a first polarization filter 3 and a second optical branch unit 4.

By using an arrangement which uses optical connectors and optical fiber to connect between the first optical branch unit 2 and the second optical branch unit 4, the current sensor may be divided into the light source block B and the current sensing coil block C. The light source block B may be installed on the ground adjacent to a high voltage pylon while only the current sensing coil block C may be separately installed adjacent to a high voltage wire. This alleviates various requirements relating to the installation and maintenance in comparison to the provision of the entire current sensor adjacent to the high voltage wire.

The separation and division as mentioned above are enabled as an advantage of using single mode optical fibers to connect between the optical elements. Specifically, the extended optical fiber 20 which connects between the first optical connector 21 and the second optical connector 22 is formed by a single mode optical fiber, and the first optical connector 21 and the second optical connector 22 then can be optical connectors which are used for connection of single mode optical fibers. Where an optical fiber which connects between optical elements is a polarization maintaining optical fiber, it is necessary as a matter of course that the corresponding optical connectors be those which are used to connect with a polarization maintaining optical fiber. However, it will be appreciated that optical connectors which are used for connection with a polarization maintaining optical fiber are much more expensive than optical connectors which are connected with single mode optical fibers. In the present embodiment, inexpensive connectors which are used to connect with single mode optical fibers can be used to connect between the blocks.

Figure 8:
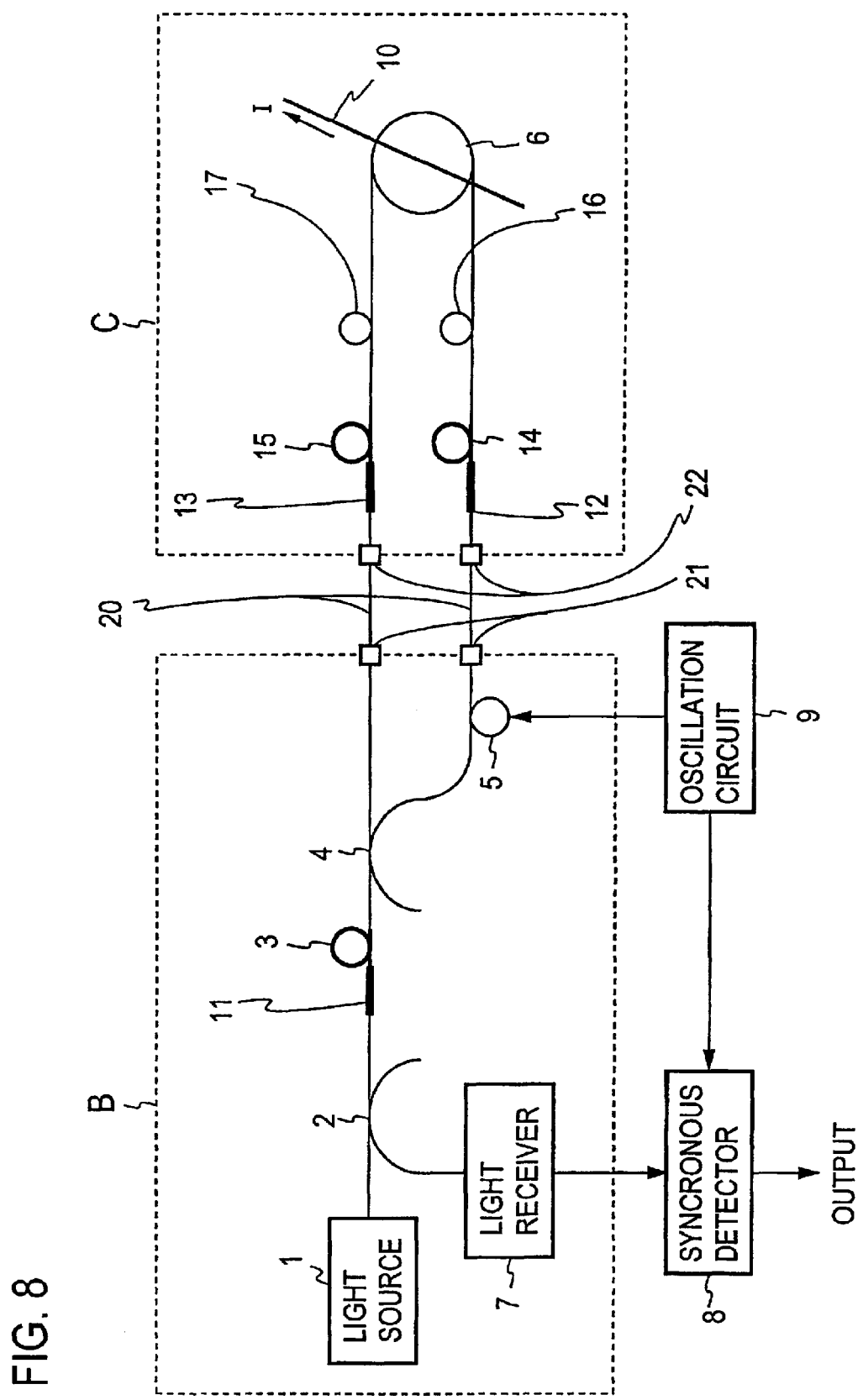
FIG. 8 is a schematic view of a further embodiment of the invention which is divided into a plurality of blocks.

FIG. 8 shows an embodiment in which a separation is made between a second optical branch unit 4 and a first quarter-wave plate 16 and a second quarter-wave plate 17 to divide the current sensor into a light source block B and a current sensing coil block C, which are connected together by using first optical connectors 21, second optical connectors 22 and two extended optical fibers 20 which connect between the first optical connectors 21 and second optical connectors 22. In this embodiment, the construction of the current sensing coil blocks C is further simplified as compared with the previous embodiment, thus allowing an alleviation of various requirements relating to the installation and maintenance. A two-core connector may be used for each of the first optical connectors 21 and the second optical connectors 22 to simplify the connection between the blocks B and C through the pair of extended optical fibers 20. The arrangement shown in FIGS. 7 and 8 in which the current sensor is divided into blocks and are connected together is also applicable to the embodiments shown in FIGS. 5 and 6. In the foregoing description, the current measurement takes place in an open loop, but may take place in a closed loop in the similar manner as in a closed loop optical fiber gyro, and the present invention is also applicable to such instance. Such an arrangement will now be briefly described. A second optical phase modulator is inserted in either optical path located between a second optical branch unit 4 and a first quarter-wave plate 16 and a second quarter-wave plate 17 to perform an optical phase modulation in accordance with an output from a detection circuit 8 so that a phase difference between a levo- and a dextro-rotatory light is reduced. An amplitude of a modulated signal from the second optical phase modulator which is obtained when the phase difference is substantially equal to zero corresponds to the detected current.

As discussed above, in accordance with the invention, Sagnac interferometer is used to detect a phase difference between levo- and dextro-rotatory lights occurring in the current sensing coil under the influence of a magnetic field. By disposing a combination of a polarization filter and a quarter-wave plate on each end of the current sensing coil, an irreciprocal phase difference which is produced under the influence of a magnetic field is maximized by propagating the levo- and dextro-rotatory lights as circularly polarized light, thus optimizing the sensitivity to the magnetic field or the current. A mensuration range which is as high as four orders of magnitude greater than the performance in the optical fiber gyro can be readily realized. The use of a combination of a polarization filter and a depolarizer simplifies at least a coupling with the light source, and depending on the manner of arrangement, inexpensive single mode optical fibers can be used for various optical elements and for the connection therebetween, thus allowing a current sensor using a Sagnac interferometer to be provided at a low cost. In particular, in a current sensor using a Sagnac interferometer, when a length adjusting optical fiber coil is connected in series with a first optical path between one branch end of a second optical branch unit and a first quarter-wave plate, and another length adjusting optical fiber coil is connected in series in a second optical path between the other branch end of the second optical branch unit and a second quarter-wave plate, a resulting reduction in the cost required is significant when an expensive single mode optical fiber can be used for this purpose in as much as the length adjusting optical fiber coil has a greatly increased length on the order of ninety meters.

When the inexpensive single mode optical fibers are used to constitute every optical path which connect between optical elements while providing combinations of a depolarizer, a polarization filter and a quarter-wave plate on each end of the current sensing coil 6, there can be provided an inexpensive current sensor of Sagnac interferometer type as a whole which is capable of a proper operation, by allowing any shift in the plane of polarization to be returned to the given plane of polarization.

In an embodiment in which an inexpensive single mode optical fiber is used to connect between the light source 1 and the first optical branch unit 2, the inexpensive single mode optical fiber is used to define the first optical branch unit 2, and the first depolarizer 11 is connected between the first optical branch unit 2 and the first polarization filter 3, there is no assurance that the plane of polarization of light can be preserved from the light source 1 to the first depolarizer 11, but the connection of the first depolarizer 11 between the first optical branch unit 2 and the first polarization filter 3 allows non-polarized light to be obtained, and this non-polarized light may be caused to impinge on the first polarization filter 3 to provide a properly linearly polarized light, which can be made to impinge on the first quarter-wave plate 16 and the second quarter-wave plate 17.

Where the counter-clockwise length adjusting optical fiber coil 71 and the clockwise length adjusting optical fiber coil 7 are wound in opposite directions from each other, the Sagnac effects which result from the respective coils can be made to cancel each other.

As mentioned previously, the current sensing coil 6, the counter-clockwise length adjusting optical fiber coil 71 and the clockwise length adjusting optical fiber coil 72 have a mutual relationship in regard to the phase difference which results from the Sagnac effect, but when the requirement $|R_c \times L_c + R_1 \times L_1 - R_2 \times L_2| < 5$ is satisfied, the phase difference resulting from the Sagnac effect which is caused by the respective rotations of the current sensing coil, the coil in the first optical path and the coil in the second optical path can be reduced.

Assuming that $R_c$ be equal to 0.5 m, $L_c$ 10 m, $R_1$ 35 mm, $L_1$ 57 m, $R_2$ 35 mm and $L_2$ 200 m, the total length of the optical fiber is equal to 267 m, which is a common optical fiber length for the optical fiber gyro which is a typical Sagnac interferometer. By choosing the right side of the inequality to be 5, the phase difference due to the Sagnac effect can be greatly reduced.

By choosing the cut-off wavelength of the optical fiber by 100 nm or more to the longer side in comparison to the wavelength of the light source, higher modes would normally propagate, but when the counter-clockwise length adjusting optical fiber coil 71 is connected in the first optical path and the clockwise length adjusting optical fiber coil 72 is connected in the second optical path, the bending effect of these coils assists the higher modes to readily leak for preventing further propagation, while allowing inexpensive products to be used.

In addition, when a separation is made between the first optical branch unit 2 and the second optical branch unit 4 while using optical connectors and optical fibers to connect therebetween, the current sensor is divided into the light source block B and the current sensing coil block C, allowing the light source block B to be installed on the ground adjacent to the high voltage pylon and allowing only the current sensing coil block C to be installed adjacent to the high voltage wire, thus alleviating various difficulties relating to the installation and maintenance in comparison to installing the entire current sensor adjacent to the high voltage wire. The division mentioned above is enabled as an effect of using single mode optical fibers to connect between optical elements. Where a separation is made between the second optical branch unit 4 and the first quarter-wave plate 16 and the second quarter-wave plate 17 to divide the current sensor into a light source block B and a current sensing coil block C, which are connected together using the first optical connectors 21, the second optical connectors 22 and the extended optical fibers 20 which connect between the first optical connectors 21 and second optical connectors 22, the arrangement of the current sensing coil block C can be further simplified in comparison to the preceding embodiment, thus alleviating various difficulties relating to the installation and maintenance.

What is claimed is:

1. A current sensor using a Sagnac interferometer comprising a light source, a first optical branch unit on which light from the light source impinges, a first depolarizer on which light from the first optical branch unit impinges and which emits non-polarized light, a first polarization filter on which light emitted from the first depolarizer impinges and which emits a given linearly polarized light, a second optical branch unit for branching light emitted from the first polarization filter into two beams, an optical phase modulator connected to one branch end of the second optical branch unit, a current sensing coil on which light from the other branch end of the second optical branch unit and light from the optical phase modulator impinge as levorotatory light and dextrorotatory light, a first quarter-wave plate inserted between the optical phase modulator and the current sensing coil, a second quarter-wave plate inserted between the other branch end of the second optical branch unit and the current sensing coil, a light detector connected to said first optical branch unit, a second depolarizer and a second polarization filter connected in series between the optical phase modulator and the first quarter-wave plate; and a third depolarizer and a third polarization filter connected in series between the other branch end of the second optical branch unit and the second quarter-wave plate, the second depolarizer being connected to the optical phase modulator side and the third depolarizer being connected to the second optical branch unit side.

2. A current sensor using a Sagnac interferometer according to claim 1 in which the first depolarizer, the second depolarizer and the third depolarizer are formed by polarization maintaining optical fibers, each of said depolarizers has its own group delay time difference between orthogonal components of light occurring therein, and the respective group delay time differences of the respective depolarizers are in the ratio greater than 1:2:4 without regard to the sequence of the first, the second and the third depolarizers.

3. A current sensor using a Sagnac interferometer according to claim 1 in which an optical fiber which forms at least one of a first optical path between one branch end of the optical branch unit and the first quarter-wave plate and a second optical path between the other branch end of the optical branch unit and the second quarter-wave plate is formed by a single mode optical fiber having cut-off wavelength which is at least 100 nm longer than the wavelength of the light source.

4. A current sensor using a Sagnac interferometer according to claim 1 further comprising a first optical connector, a second optical connector, and an extended optical fiber connecting between the first optical connector and the second optical connector, which are inserted between the first optical branch unit and the second optical branch unit.

5. A current sensor using a Sagnac interferometer comprising:

a light source, a light detector, an optical branch unit, connecting means for connecting said light source and light detector to said optical branch unit on which light from the light source impinges and which branches the thus impinged light into two beams, an optical phase modulator connected to one branch end of the optical branch unit, a first depolarizer connected to the optical phase modulator, a first polarization filter connected to the first depolarizer, a first quarter-wave plate connected to the first polarization filter, a second depolarizer connected to the other branch end of the optical branch unit, a second polarization filter connected to the second depolarizer, a second quarter-wave plate connected to the second polarization filter, and a current sensing coil connected to the first quarter wave plate and to the second quarter wave plate, on which a levorotatory light and dextrorotatory light from the second quarter wave plate and the first quarter wave plate impinge.

6. A current sensor using a Sagnac interferometer according to claim 5 in which the first depolarizer and the second depolarizer are formed by polarization maintaining optical fibers, each of said depolarizers has its own group delay time differences between the orthogonal components of light occurring therein, and the respective group delay time differences of the respective depolarizers are in a ratio equal to or greater than 1:2.

7. A current sensor using a Sagnac interferometer comprising:

a light source, a light detector, an optical branch unit, connecting means for connecting said light source and light detector to said optical branch unit on which light from the light source impinges and which branches the thus impinged light into two beams, an optical phase modulator connected to one branch end of the optical branch unit, a first quarter-wave plate connected to the optical phase modulator, a second quarter-wave plate connected to the other branch end of the optical branch unit, a current sensing coil connected to the first quarter wave plate and to the second quarter wave plate, on which a levorotatory light and dextrorotatory light from the second quarter wave plate and the first quarter wave plate impinge, a first length adjusting optical coil connected in series in a first optical path between the one branch end of the optical branch unit and the first quarter-wave plate, and a second length adjusting optical fiber coil connected in series in a second optical path between the other branch end of the optical branch unit and the second quarter-wave plate, in which the current sensing coil has a center axis which is substantially aligned on a common rectilinear line as the center axes of the first and the second length adjusting optical fiber coils, the current sensing coil and the both length adjusting optical fiber coils satisfying the following inequality:

$$|R_c \times L_c + R_1 \times L_1 - R_2 \times L_2| < 5$$

where $R_c$: a mean radius of the current sensing coil $L_c$: optical fiber length of the current sensing coil $R_1$: a mean radius of the first length adjusting optical fiber $L_1$: optical fiber length of the first length adjusting optical fiber coil $R_2$: mean radius of the second length adjusting optical fiber coil $L_2$: optical fiber length of the second length adjusting optical fiber coil.

8. A current sensor using a Sagnac interferometer according to claim 7, further comprising:

a first depolarizer, a first polarization filter connected in series to the first depolarizer, the series circuit of the first depolarizer and first polarization filter being inserted in said first optical path such that the first depolarizer is connected to the first length adjusting optical coil and the first polarization filter is connected to the first quarter-wave plate, a second depolarizer, and a second polarization filter connected in series to the second depolarizer, the series circuit of the second depolarizer and second polarization filter being inserted in said second optical path such that the second depolarizer is connected to the second length adjusting optical coil and the second polarization filter is connected to the second quarter-wave plate.

9. A current sensor using a Sagnac interferometer according to claim 7, wherein said connecting means comprises:

an optical directional coupler on which light from the light source impinges, a first depolarizer on which light from the optical directional coupler impinges and which emits non-polarized light, and a first polarization filter on which light emitted from the first depolarizer impinges and which emits a given linearly polarized light.

10. A current sensor using a Sagnac interferometer according to one of claim 1, 5, or 7, further comprising a first optical connector, a second optical connector and a first extended optical fiber connecting between the first optical connector and the second optical connector, which are inserted in a first optical path between the second branch unit and the first quarter-wave plate, and a third optical connector, a fourth optical connector and a second extended optical fiber connecting between the third optical connector and the fourth optical connector, which are inserted in a second optical path between the second branch unit and the second quarter-wave plate.

* * * * *

UNITED STATES PATENT AND TRADEMARK OFFICE
CERTIFICATE OF CORRECTION

PATENT NO. : 6,831,749 B2
APPLICATION NO. : 10/070076
DATED : December 14, 2004
INVENTOR(S) : Aritaka Ohno et al.

It is certified that error appears in the above-identified patent and that said Letters Patent is hereby corrected as shown below:

<u>Title page,</u>
Insert item -- [73] Assignee: Kabushiki Kaisha Toshiba, Tokyo, Japan (part interest). --.

Signed and Sealed this

Eighteenth Day of July, 2006

JON W. DUDAS
*Director of the United States Patent and Trademark Office*